United States Patent [19]

Bellavance

[11] 4,077,817
[45] Mar. 7, 1978

[54] MAKING A SEMICONDUCTOR LASER STRUCTURE BY LIQUID PHASE EPITAXY

[75] Inventor: David W. Bellavance, Dallas, Tex.

[73] Assignee: Texas Instruments Incorporated, Dallas, Tex.

[21] Appl. No.: 784,399

[22] Filed: Apr. 4, 1977

Related U.S. Application Data

[63] Continuation of Ser. No. 645,776, Dec. 31, 1975, abandoned.

[51] Int. Cl.² ..................................... H01L 21/208
[52] U.S. Cl. ............................ 148/171; 148/33.5; 148/172; 252/62.3 GA; 357/18; 357/56; 331/94.5 H
[58] Field of Search ............. 148/33.5, 171, 172; 252/62.3 GA; 357/18, 56; 331/94.5 H

[56] References Cited

U.S. PATENT DOCUMENTS

| 3,883,219 | 5/1975 | Logan et al. ............... 331/94.5 H X |
| 3,884,733 | 5/1975 | Bean ....................... 148/175 |
| 3,893,044 | 7/1975 | Dumke et al. ............. 357/18 |
| 3,902,133 | 8/1975 | Watts ...................... 331/94.5 H |
| 3,956,727 | 5/1976 | Wolf ....................... 357/18 |

Primary Examiner—G. Ozaki
Attorney, Agent, or Firm—Gary C. Honeycutt; Jim Comfort; Rene E. Grossman

[57] ABSTRACT

A semiconductor laser structure has side facets perpendicular to its substrate and a flat top. The central cavity is an elongated rectangular cavity. A substrate having (100) orientation has a mask patterned thereon with a window having an elongated central member and at least two cross members perpendicular to the axis of the elongated central member. The semiconductor material is grown thereon by liquid phase epitaxy.

4 Claims, 5 Drawing Figures

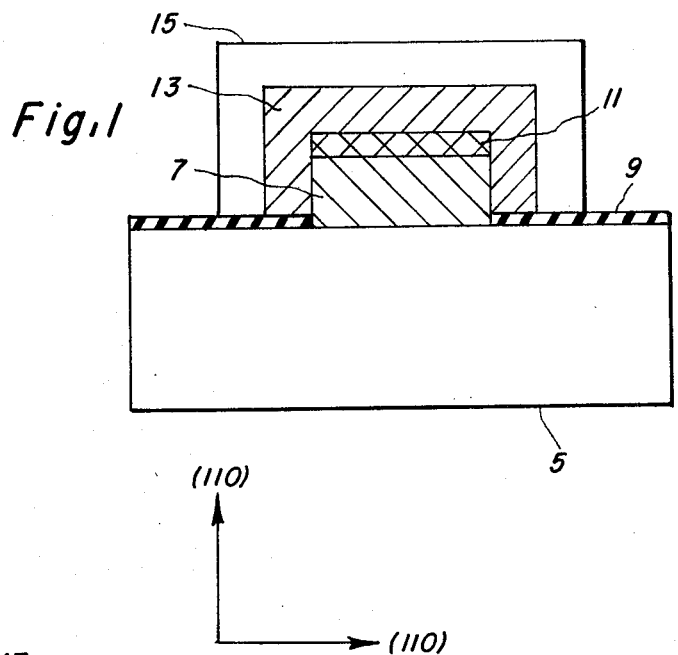
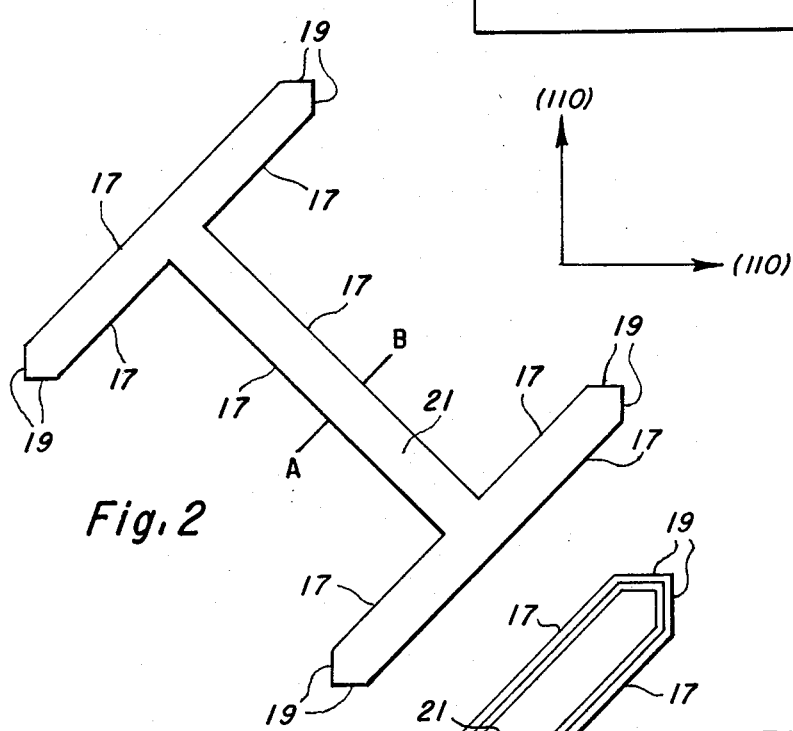
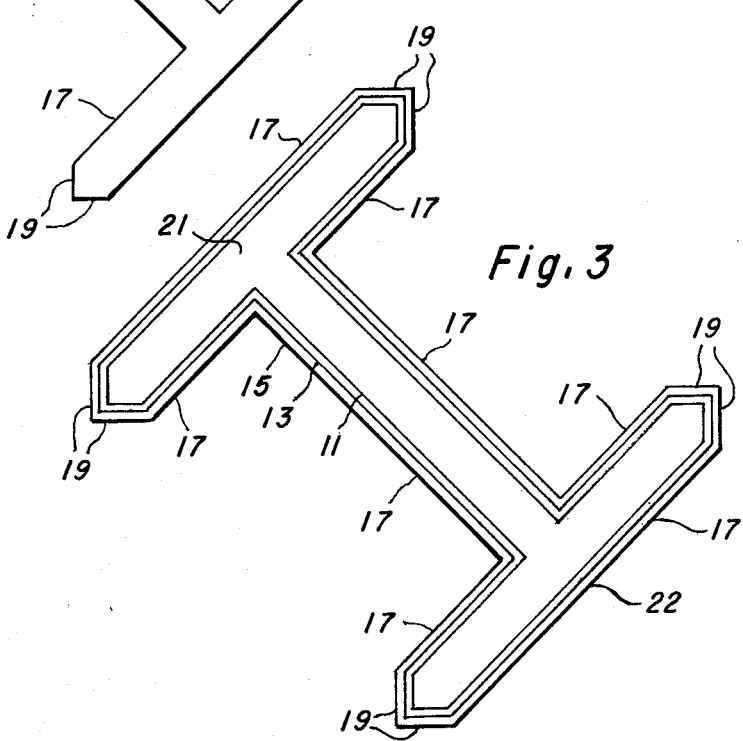

MAKING A SEMICONDUCTOR LASER STRUCTURE BY LIQUID PHASE EPITAXY

This is a continuation of application Ser. No. 645,776, filed Dec. 31, 1975, now abandoned.

This invention is directed to a semiconductor structure and a method of making a semiconductor structure, and more particularly, to a semiconductor structure which has side facets perpendicular to its substrate and a flat top.

Semiconductor structures have been made previously having side facets perpendicular to their substrate with flat tops; however, in the past, such structures necessarily have been made by vapor phase epitaxy on (110) substrates. Selective liquid phase epitaxy has been used for making unique semiconductor structures; however, no sturcture has been made which has all side facets perpendicular to the substrate with a flat top. U.S. Pat. No. 3,425,879, issued February 4, 1969, assigned to Texas Instruments Incorporated, discloses formation of selective epitaxy structures made by vapor phase processes.

It is therefore an object of this invention to provide a new and improved semiconductor structure. Another object of this invention is to provide a new and improved semiconductor structure having side facets perpendicular to its substrate with a flat top parallel to the substrate.

A specific object of this invention is to provide a semiconductor structure having a central cavity terminated by opposite parallel sides perpendicular to a substrate and with a top facet flat and parallel to the substrate.

The specific embodiment shown in the drawings and described hereinafter is a semiconductor laser, which is described in co-pending patent application Ser. No. 645,773 filed Dec. 31, 1975 now abandoned by David W. Bellavance, assigned to Texas Instruments Incorporated, and filed concurrently with this application.

This semiconductor structure and the method of making such a semiconductor structure can be made from many semiconductor materials.

Semiconductor materials with zinc blende or diamond crystal structures can be used to fabricate this semiconductor structure. A semiconductor laser using III-V materials made according to the teachings of this invention will be described first.

In the drawings,

FIG. 1 shows a cross-section of a semiconductor laser fabricated according to this invention.

FIG. 2 shows a top view of the mesa of the semiconductor laser fabricated according to this invention.

FIG. 3 shows a top view of a cross-section through the active layer in the laser.

Figure 4:
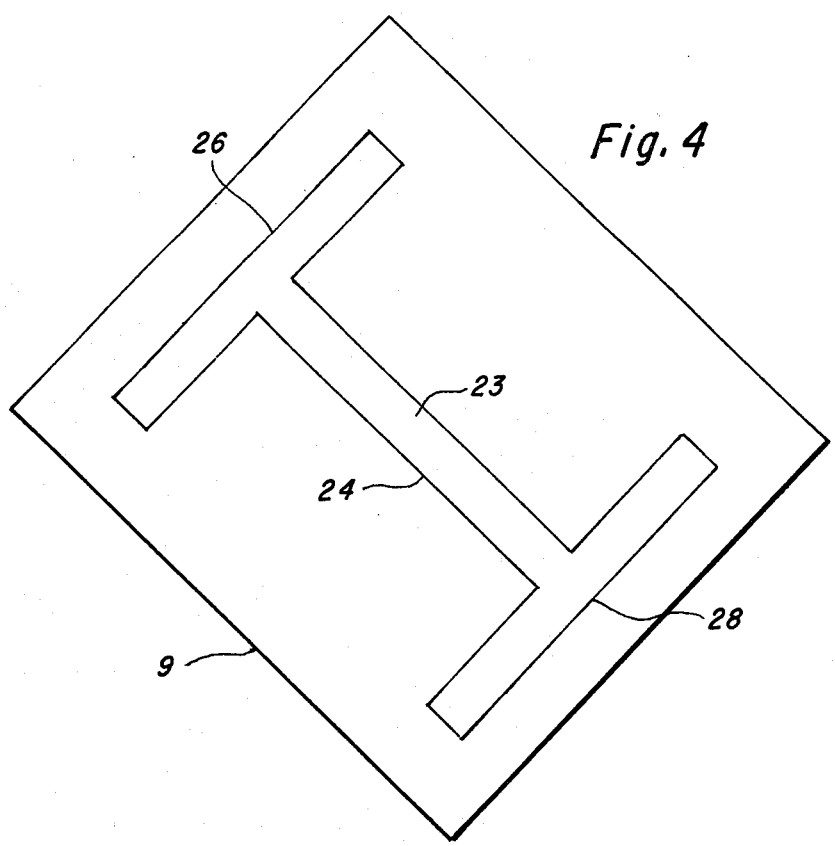
FIG. 4 shows the mask pattern for the semiconductor laser.

Referring first to FIG. 1, an embedded double heterostructure laser configuration is shown constructed according to this invention. An n-type gallium aluminum arsenide mesa 7 is shown grown on the n-type gallium arsenide substrate 5. A dielectric mask 9 is used to define the area on the substrate 5 where the gallium aluminum arsenide mesa 7 is grown. An active layer of p-type gallium arsenide, layer 11, is deposited on the n-type gallium aluminum arsenide mesa 7. A p-type gallium aluminum arsenide layer 13 is deposited over the p-type gallium arsenide active layer 11 in a manner such that it surrounds, in addition to the p-type active region gallium arsenide layer 11, the n-type gallium aluminum arsenide layer 7. Then to complete the structure, a p-type gallium arsenide layer 15 is deposited over the p-type gallium arsenide layer 13.

The n-type gallium arsenide substrate is a (100) oriented substrate. The deposition of the layers 7, 11, 13 and 15 is by a selective liquid phase epitaxy (in a manner to be described in more detail later).

FIG. 2 shows the top view of the grown mesa, a cross-section of which is shown in FIG. 1. The cross-section is taken along a line AB through central lasing cavity of the semiconductor laser. The semiconductor laser as fabricated has the I-bar type shape as shown in FIG. 2. The four layers deposited on the gallium arsenide substrate 5 shown in cross-section in FIG. 1, after construction, have the structure shown in FIG. 2. The facets of the semiconductor laser as grown by a liquid phase epitaxy on a (100) gallium arsenide substrate are such that the facets 17 are all (100) facets perpendicular to the substrate 5. The facets 19 as shown are (111) facets which are non-perpendicular to the substrate 5. The top facet 21 of the semiconductor mesa laser shown is also a (100) facet parallel to the substrate. The structure of the semiconductor laser shown in FIG. 2 is the total mesa laser of which a cross-section is shown in FIG. 1. Each deposited layer of the cross-section including the gallium aluminum arsenide layer 7, the gallium arsenide 11, the gallium aluminum arsenide layer 13, and the gallium arsenide 15 have the same facet structure as shown in FIG. 2. In addition, the bottom facet of each deposited layer will also have a (100) facet parallel to the substrate.

Referring now to FIG. 3 for a top cutaway view through the gallium arsenide active layer 11 in FIG. 1, the structure as shown is formed in the I-shaped form as shown in FIG. 2. The active gallium arsenide layer 11 is surrounded by the gallium aluminum arsenide layer 13 which is in turn surrounded by the gallium arsenide layer 15. The gallium aluminum arsenide layer 7 is underneath the gallium arsenide active layer 11 so it is not shown in FIG. 3. The active gallium arsenide layer 11 has the same facets shown in FIG. 2 with a bottom and top (100) facet parallel to the substrate 5, vertical (100) facets 17 perpendicular to the gallium arsenide substrate 5, and (111) facets 19 which are not perpendicular to the gallium arsenide substrate 5. The gallium arsenide layer 11 is the active layer in the lasing cavity. The outer gallium arsenide layer 15 in line with the longitudinal axis of the active element gallium arsenide layer 11 forms the mirror surfaces for the lasing cavity. These are shown as the areas 21 and 22 in FIG. 4. As has been noted, the facets at this position of the outer layer gallium arsenide layer 15 are formed in the (100) plane so that they are perpendicular to the substrate 5 and parallel to each other. The mirror surfaces 21 and 22 must be parallel to perform the lasing function. The lasing occurs in the active region 11 between the mirrors 21 and 22 in the longitudinal direction. This active region 11 as has been noted is bounded by the gallium aluminum arsenide layers 7 and 13 for optical and carrier confinement.

Referring now to FIG. 4, this figure shows the shape of the window in the dielectric mask 9 shown in FIG. 1. The window of the dielectric mask 9 defines an I- shaped pattern with all of the walls of the window 23 oriented in a (100)direction so all of the walls are parallel to the (100) planes. The fabrication is then carried out in a liquid epitaxy process. The gallium arsenide substrate 5 is used with the semiconductor laser fabricated on it in a manner to be described in FIGS. 1, 2, and 3. First, a layer of dielectric material is coated completely over the substrate 5 to a thickness on the order of 2,000 angstroms. The dielectric material could be silicon oxide, silicon nitride, aluminum oxide, and the like. The pattern shown in FIG. 4 is defined photolithographically. The pattern is in the general I-bar form such as that shown in FIG. 4. The I-bar window is formed from a longitudinal member 24 with cross bars 26 and 28 perpendicular to the longitudinal member 24 and at each end of such longitudinal member 24. A typical length for the longitudinal member is in the order of 14–28 mils, with each cross bar 24 and 26 in the order of 3–6 mils. The width of the window 23 varies from 5 microns to 25 microns. Windows are opened in the dielectric layer according to the pattern defined by the photolithography. The window opening is done by wet chemical techniques or by plasma etching.

After the window has been opened according to the pattern shown in FIG. 4, then the liquid phase epitaxy process is initiated to fabricate the structure shown in FIGS. 1, 2, and 3. First, the n-type gallium aluminum arsenide layer 7 is grown to a specified thickness. A normal thickness is in the order of 2 to 3 microns. Then the active gallium arsenide layer is grown to a specified thickness such as 1 micron. Following that, the gallium aluminum arsenide layer 13 is grown to a thickness such as 2 microns, and it is followed by growing the gallium arsenide layer 15 thickness to about 1 micron. These dimensions are simply typical examples and can of course be modified and changed according to the preferred device characteristics and/or to improve laser performance. By fabricating the device using the pattern shown in FIG. 4 by liquid epitaxy, the semiconductor laser mesa is grown to come up with the structure such as that shown in FIGS. 1, 2, and 3. The facets are as shown with the face at each longitudinal end of the mesa having the vertical (100) facets perpendicular to the plane of the gallium arsenide substrate. At each end of the cross bars of the I-bar the facets 19 are (111) facets. However, since the lasing occurs between the mirror facets 21 and 22, the (111) facets do not interfere with the lasing of the semiconductor laser.

The length of each cross bar 26 and 28 must be such that when the laser structure is grown the (111) facets are removed from the longitudinal axis 24 of the laser structure and there are vertical (100) facets at end of the longitudinal axis of the laser structure.

A semiconductor laser has been fabricated according to the invention disclosed and described heretofore. It lases at room temperature. The output wavelength is 8900 angstroms. The threshold current is 1.3 amperes, the threshold current density is 13 kiloamperes per square centimeter. The external differential quantum efficiency is 13 percent.

The semiconductor laser has been described with reference to a specific III-V compound and III-V alloys. The specific III-V compound used was gallium arsenide while the specific III-V alloy was gallium aluminum arsenide. Other III-V materials could be used where III is Al, Ga, or In and V is P, As, or Sb. The lasing cavity may be an alloy as well as a compound.

Such materials can be described as belonging to the general families III-V (e.g. GaAs, InAs, GaP, etc.): III-III'-V (e.g. $Ga_{1-x}Al_xAs$, $In_{1-x}Al_xAs$, $Ga_{1-x}Al_xP$, etc.); III-V-V' (e.g. $GaAs_{1-x}P_x$, $GaAs_{1-x}Sb_x$, $InAs_{1-x}P_x$, etc.); III-III'-V-V' (e.g. $Ga_{1-x}In_xAs_{1-y}P_y$, $Ga_{1-x}Al_xAs_{1-y}P_y$, $Ga_{1-x}In_xAs_{1-y}Sb_y$, etc.); III-III'-III''-V (e.g. $Ga_{1-x-y}In_xAl_yAs$, $Ga_{1-x-y}In_xAl_yP$); III-V-V'-V'' (e.g. $GaAs_{1-x-y}P_xSb_y$, $InAs_{1-x-y}P_xSb_y$); III-III'-III''-V-V' (e.g. $Ga_{1-x-y}In_xAl_yAs_{1-z}Sb_z$ etc), $As_{1-z}P_z$, $Ga_{1-x-y}In_xAl_y$(etc.); III-III'-V-V'-V'' (e.g. $Ga_{1-x}Al_x As_{1-y-z}P_ySb_z$, $Ga_{1-x}In_xAs_{1-y-z}P_ySb_z$ etc.); and III-III'-III''-V-V'-V'' (e.g. $Ga_{1-x-y}In_xAl_yAs_{1-z-m}P_zSb_m$).

In the double heterostructure configuration, the index of refraction of the layers on either side of the active laser layer must be lower than the index of refraction in the active layer.

The specific mesa laser shown shows a specific n-p-type relationship. This can obviously be reversed as desired.

Figure 5:
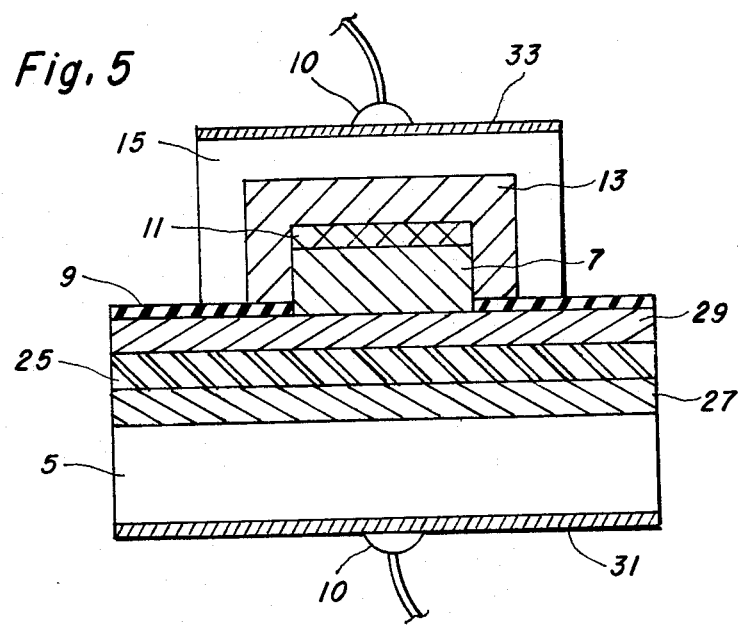
FIG. 5 shows a cross-section of a semiconductor laser fabricated according to this invention and grown on a waveguide structure.

FIG. 5 shows the cross-section of a mesa semiconductor laser constructed according to this invention grown on a waveguide structure. Such a waveguide structure is shown in issued U.S. Pat. No. 3,902,133 assigned to Texas Instruments Incorporated. The actual waveguide is gallium aluminum arsenide layer 25 with two gallium aluminum arsenide layers 27 and 29 on each side of the waveguide layer 25. These two layers 27 and 29 are used for optical confinement of the signal transferred through waveguide 25. The coupling between the laser and the waveguide is by evanescent field coupling such as that in a manner described in the patent. Contacts 10 are wires which are gold bonded to a metal contact layer 31 and 33 which are plated or evaporated on to the gallium arsenide surfaces.

It is also possible to have another type of waveguide in which layer 29 is omitted.

The index of refraction of layer 25 must be higher than layers 27 and 29 in a manner described in the patent.

The semiconductor laser embodiment described and shown in the drawings is a double heterostructure. A homojunction laser or a single heterostructure laser may be fabricated according to the teachings of this invention.

A specific embodiment of the semiconductor structure has been described in the form of a semiconductor laser made from III-V materials.

Other semiconductor structures can also be made using other semiconductor materials. Such structures would be made so that they have an elongated rectangular cavity with side facets perpendicular to the substrate and a flat top parallel to the substrate.

They need not necessarily be used for lasing. The mask on the substrate has a pattern with a window having an elongated central member and at least two cross members perpendicular to the axis of the elongated central member. The semiconductor material is grown by liquid phase epitaxy.

A substrate having (100) orientation has the mask pattern therein. The mask is orientated such that the axis of the elongated central member is in the (100) direction. The semiconductor material is grown by liquid phase epitaxy, so that the side and end facets of the resulting elongated central member of the structure are perpendicular to the substrate, and its top facet is parallel to the substrate. The (111) facets at the end of the cross bar members of the structure are not perpendicular to the substrate.

Multiple, elongated members may be interconnected to form different semiconductor structures.

Semiconductor structures fabricated as described may be used as light emitting diodes, detector arrays covering a wide range of wavelengths and microwave devices, as well as the laser shown and described.

The structure may be prepared with materials having the zinc blende, diamond or chalcopyrite crystal structures. Examples of such materials, but not restricted only to the materials listed, having these crystal structures are (1) zinc blende structure: group III-V compounds and alloys (i.e., GaAs, InAs, GaP, $GaAs_{1-x}P_x$, $Ga_{1-x}Al_xAs$, $Ga_{1-x}In_xAs_{1-y}P_y$), group II-VI compounds and alloys (ZnS, ZnSe, CdTe, HgTe, $Hg_{1-x}Cd_xTe$, $HgSe_{1-x}Te_x$), and group IV compounds ($\beta$-SiC); (2) diamond structure: group IV elements (Si, Ge); and (3) chalcopyrite structure: ternary chalgonides and mixed compounds ($AgInS_2$, $CuInSe_2$, $CuInTe_2$, $CuIn(Se_{1-x}Te_x)_2$, $AgGaS_2$).

The structure may be useful with only one end defined by a perpendicular cross-member, e.g., the end of a grown waveguide with a perpendicular face for butting an optical fiber up against.

What is claimed is:

1. A method of fabricating a semiconductor laser comprising the steps of:
    depositing a mask on a substrate of group III-V semiconductor material having a (100) orientation;
    defining a window in said mask, said window having an elongated central pattern and cross-bar pattern at each end of and perpendicular to the axis of said elongated central pattern, said axis of said elongated central member oriented in a (100) direction; and
    fabricating by selective liquid phase epitaxy a mesa of semiconductor material on said substrate in the window defined in said mask, said mesa having a flat top parallel to said substrate and oppositely spaced (100) crystallographic facets perpendicular to said substrate and parallel to one another, said crystallographic facets; forming the reflecting mirrors of a longitudinal lasing cavity.

2. A method of fabricating a semiconductor mesa as set forth in claim 1, wherein fabricating said mesa comprises the steps of:
    depositing a first layer of gallium aluminum arsenide on said substrate through said window;
    depositing a second layer of gallium arsenide on top of said first layer;
    depositing a third layer of gallium aluminum arsenide so as to surround said second layer and said first layer; and
    depositing a fourth layer of gallium arsenide so as to surround said third layer.

3. A method of fabricating a semiconductor laser comprising the steps of:
    depositing a mask on a substrate of group III-V semiconductor material having a (100) orientation;
    defining the window in said mask, said window having an elongated central pattern and cross-bar pattern at each end of and perpendicular to the axis of said elongated central pattern, said axis of said elongated central member oriented in a (100) direction;
    depositing by selective liquid phase epitaxy a mesa of gallium aluminum arsenide on said substrate in the window defined in said mask, said mesa having (100) crystallographic side facets perpendicular to said substrate and parallel to one another and a flat top parallel to said substrate;
    depositing a first layer of gallium aluminum arsenide on top of said mesa, said first layer also having (100) crystallographic side facets perpendicular to said substrate and parallel to one another and a flat top parallel to said substrate, said first layer comprising an active layer of a longitudinal lasing cavity defined between reflecting mirrors formed by said crystallographic facets; and
    depositing a second layer of gallium aluminum arsenide so as to surround said mesa and said first layer, said second layer also having (100) crystallographic side facets perpendicular to said substrate and parallel to one another and having a flat top parallel to said substrate.

4. The method of fabricating a semiconductor laser as set forth in claim 3 further including the step of depositing a third layer of gallium arsenide so as to surround said second layer providing means for contacting said laser, said third layer also having (100) crystallographic side facets perpendicular to said substrate, and parallel to one another and a flat top parallel to said substrate.

* * * * *